United States Patent (10) Patent No.: US 9,214,952 B2
Claus et al. (45) Date of Patent: Dec. 15, 2015

(54) SENSOR TIME

(71) Applicant: Robert Bosch GmbH, Stuttgart (DE)

(72) Inventors: Thomas Claus, Tuebingen (DE); Rainer Dorsch, Dettenhausen (DE); Gerhard Lammel, Tuebingen (DE)

(73) Assignee: ROBERT BOSCH GMBH, Stuttgart (DE)

( * ) Notice: Subject to any disclaimer, the term of this patent is extended or adjusted under 35 U.S.C. 154(b) by 0 days.

(21) Appl. No.: 14/397,111

(22) PCT Filed: Mar. 6, 2013

(86) PCT No.: PCT/EP2013/054505
§ 371 (c)(1),
(2) Date: Oct. 24, 2014

(87) PCT Pub. No.: WO2013/159972
PCT Pub. Date: Oct. 31, 2013

(65) Prior Publication Data
US 2015/0123827 A1 May 7, 2015

(30) Foreign Application Priority Data
Apr. 27, 2012 (DE) .......................... 10 2012 207 026

(51) Int. Cl.
H03M 1/12 (2006.01)
G01D 9/00 (2006.01)

(52) U.S. Cl.
CPC ............. *H03M 1/1255* (2013.01); *G01D 9/005* (2013.01)

(58) Field of Classification Search
USPC .................................................. 341/110–172
See application file for complete search history.

(56) References Cited

U.S. PATENT DOCUMENTS 7,382,780 B1 6/2008 Moretti et al.
2011/0313697 A1* 12/2011 Staton et al. .................... 702/63

FOREIGN PATENT DOCUMENTS

EP 1 742 187 1/2007
WO WO 2010/056246 5/2010

OTHER PUBLICATIONS

International Search Report for PCT/EP2013/054505, dated Jan. 3, 2014.

* cited by examiner

*Primary Examiner* — Howard Williams
(74) *Attorney, Agent, or Firm* — Kenyon & Kenyon LLP

(57) ABSTRACT

A sensor includes: a detection element; an analog front end; a digital back end, the digital back end being connected to a control unit via a digital interface, and the sensor providing sampled data in the digital back end; and a timer unit for providing pieces of time information of the sampled data in the digital back end which the control unit is able to access via the digital interface.

7 Claims, 5 Drawing Sheets

SENSOR TIME

BACKGROUND OF THE INVENTION

1. Field of the Invention

The present invention relates to a sensor including a detection element, an analog front end and a digital back end; the digital back end is to be connected to a control unit via a digital interface, the sensor providing sampled data in the digital back end. The present invention further relates to a method for assigning a piece of time information to sampled measuring data of a sensor.

2. Description of the Related Art

U.S. Pat. No. 7,382,780 B1 describes retrospective time synchronization using sample value counters and a real-time clock as well as the collection of data in frames. The document does not relate to sub-sampling interval times.

A sensor is typically composed of a detection element, an analog front end and a digital back end, as is apparent from FIG. 1. The detection element converts the physical variable to be measured into an analog signal, and the analog front end controls the detection element and processes the analog signal, converting the same into a digital signal. The digital back end carries out data filtering, event creation, and control of the analog front end, for example. One or multiple sensors is/are connected via a digital interface of the digital sensor back end to a control unit, for example, an application processor in a smart phone or Internet tablet, a dedicated microcontroller (μC), or an arbitrary other implementation of a control unit as hardware or software. The sensor samples sensor data at a configurable output data rate odr and stores the processed sensor data sample values in the digital back end. If necessary, the digital back end may include a FIFO memory for storing the sensor data. The control unit reads out the sensor data from the digital back end via the digital interface. The sensors have no notion of the global time, i.e., during processing of the sensor data in the control unit, it is typically assumed that the time at which the control unit reads out the sensor data is identical to the time at which the sensor data were sampled.

Sensors typically implement filter functions, for example, a low-pass filter, having a particular bandwidth limit.

The output data rate of the sensor often depends on ambient parameters such as the temperature. If these parameters change, fluctuations of 10% of the output data rate are not uncommon. The control unit, having an independent and typically more precise time reference, reads out the data asynchronously from the sensor at a read-out data rate rdr as shown in FIG. 2.

Each sample interval box 10 indicates a new sensor data sample value, which is stored in the digital part; the arrows at the bottom indicate read-outs 30 of the control unit from the sensor, which in this example occur more frequently than the sensor generates output data. Since it is typically assumed that the sensor data sample time and the sensor data read-out time are identical, this means that the delay between the generation of output data and the read-out is not taken into consideration. This assumption introduces time jitter, which is indicated by jitter boxes 20. The average jitter added by the described mechanism is given by $$\text{jitter}_{average} = \text{MIN}(1/odr, 1/rdr)/2.$$

Often, data from more than one sensor are used to calculate fusion data, for example, orientation in the space or position of a mobile device. These techniques are often used in inertial measurement units (IMUs). Jitter impairs the accuracy of the calculated data.

In addition to the mismatch between odr and rdr there is latency, which may impact certain applications, for example, real-time game applications.

There are three known approaches to the above-described problem. Increasing the read-out data rate rdr reduces the average jitter according to the equation for $\text{jitter}_{average}$. Increasing the output data rate odr reduces the average jitter according to the equation for $\text{jitter}_{average}$. The increase in the output data rate is supported by present sensors, for example, the triaxial acceleration sensor BMA255 Digital. Triggering read-outs by interrupts is another technique, which is intended to require the sensor to send an interrupt to the control unit when new data are available. This then initiates the read-out of data from the sensor.

However, these known approaches may have several disadvantages. Increasing the read-out data rate rdr increases the workload for the control unit. If the control unit is implemented as software and the executing processor has only low utilization, this approach increases the number of transitions of the executing processor from inactive to on-states, whereby the power consumption is significantly increased.

Increasing the output data rate odr means that noise on the sensor data is increased when the sampling rate is increased. If only the output data rate is changed independently of the bandwidth of the low-pass filter, the implementation of the digital back end becomes more complex. This increases the required silicon surface and the power consumption of the digital back end. As a result, the costs for the sensor hardware and for operating the sensor increase.

Triggering read-outs by interrupts requires separate lines for the interrupt signal, in addition to the typical interfaces such as I2C, thus adding costs. In addition, processing interrupts by software on the control unit is not very efficient since an interrupt requires a context change in the processor. This impacts the cache hit ratios in the processor and similar performance capability parameters. If a large number of sensors is connected to one processor, this approach does not scale well. Moreover, interrupts are not directly supplied in many modern mobile platforms, and the approach thus deals with the problem only partially.

BRIEF SUMMARY OF THE INVENTION

It is the object of the present invention to create a sensor, whose measuring data are preferably precisely assignable to a measuring point in time. It is also an object of the present invention to create a method for assigning measuring data of a sensor to a measuring point in time.

The sensor according to the present invention includes: a detection element; an analog front end; a digital back end, the digital back end being connected to a control unit via a digital interface, and the sensor providing sampled data in the digital back end; and a timer unit for providing pieces of time information of the sampled data in the digital back end which the control unit is able to access via the digital interface.

DETAILED DESCRIPTION OF THE INVENTION

Figure 1:
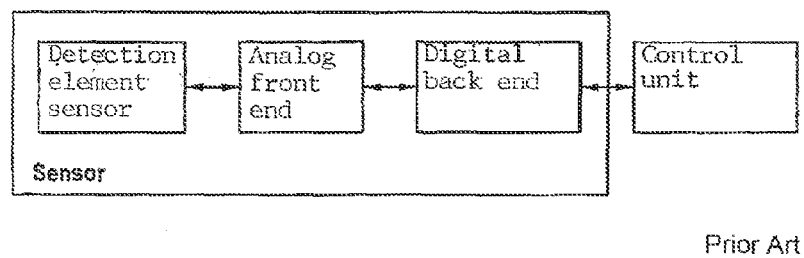
FIG. 1 shows a previously known sensor and a control unit.
Figure 3:
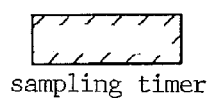
FIG. 3 shows a sampling timer of a sensor according to a first specific embodiment of the present invention.

FIG. 3 shows a sampling timer of a sensor according to a first specific embodiment of the present invention. In a first specific embodiment of the present invention, a register is added to the sensor described in FIG. 1. The register contains the age of the sensor data and is updated by the digital back end of the sensor. The additional register allows the control unit to read out the age of the sensor data since their generation. This may be implemented as a separate counter, or an existing counter may be reused, whereby data sampling is controlled. The counter is reset after renewed data sample value generation and continues to run until data are read out by the control unit, or longer. The "sampling timer" is the value of the sampling time register, normalized to a sampling period. The sampling period is given by 1/odr. For example, for a sampling period of 10 ms, the sampling timer would have the value 0.3 sampling periods (at the read-out point in time) when the data sample value is 3 ms old at the point in time of the read-out. Jitter may thus be reduced.

The reading of the sampling timer allows the control unit to determine how old the data are at the point in time they are read out from the sensor. Ideally, this sampling time register may be read out atomically (in one data block without interruption) with the sensor data. With regard to its control system time, the control unit is able to reconstruct the point in time in the past at which the sensor data were in fact generated. If there is more than one sensor in a system, for example, an accelerometer, a yaw rate sensor and a magnetometer, synchronized sensor data are important for sensor fusion algorithms. Reduced jitter allows better sensor data synchronization. As a result, the performance capability of the sensor fusion algorithm increases.

Figure 4:
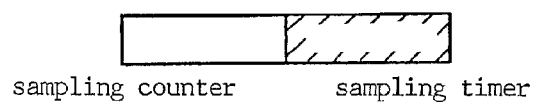
FIG. 4 shows a sensor timer, which is composed of a sampling counter and a sampling timer of a sensor, according to a second specific embodiment of the present invention.

FIG. 4 shows a sensor timer, which is composed of a sampling counter and a sampling timer of a sensor, according to a second specific embodiment of the present invention. In a second specific embodiment of the present invention, a register is added to the sensor described in FIG. 3. If a sampling counter is present in addition to the sampling timer, this shall be referred to as sensor time. This allows the sensor clock to be measured as a function of the control system clock. The control unit may read out the sensor time at two points in time and calculate the real output data rate rodr. The real output data rate allows the prediction of when the next generated sensor data will be available, which may be used to reduce latency during the reading of sensor data, without significantly increasing performance. In addition, it allows the data generation times of the data frames in the FIFO to be estimated, whereby once again better data synchronization is made possible.

Figure 5:
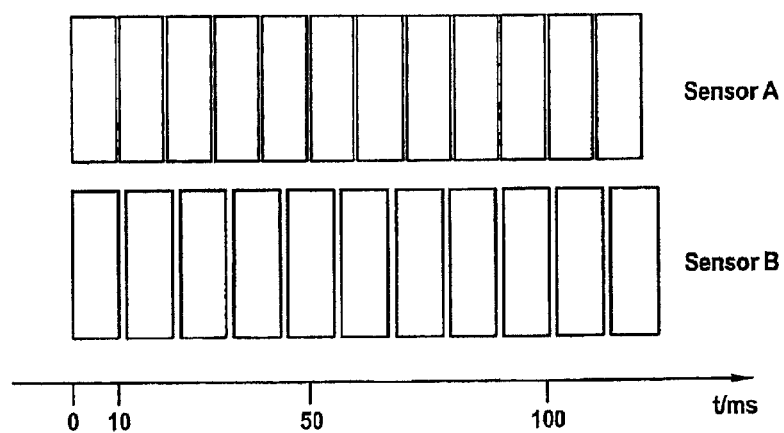
FIG. 5 shows two sensors, which in each case store their sample values in a FIFO memory at slightly different sampling rates.

FIG. 5 shows two sensors, which in each case store their sample values in a FIFO memory at slightly different sampling rates, although the configured output data rate could be identical for the sensors. In one example, the figure shows the problem of asynchronous sampling of two sensors. Starting at the same moment as the sampling, sensor A stores 12 sample values in a FIFO during a defined time period, while sensor B stores only 11 sample values. Without a sensor timer, the sample values are mismatched in the FIFO in this example by more than one sampling period if the sampling time is calculated based on the read-out time and the configured ODR.

Figure 6:
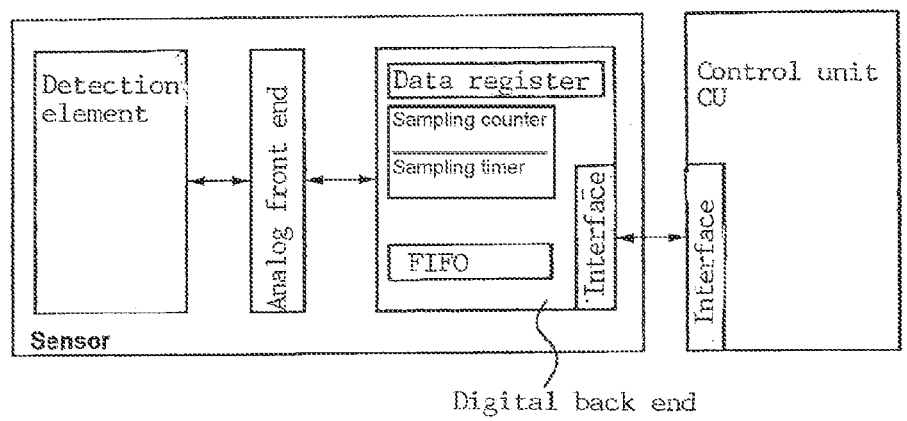
FIG. 6 shows a sensor according to the present invention and a control unit.

FIG. 6 shows a sensor according to the present invention and a control unit. In addition to the previously known sensor of FIG. 1, a data register for sensor data, a sampling timer and a sampling counter are provided in the digital back end. To read out measured data, the sampling counter and sampling time, control unit CU is connected to the sensor via an interface. In addition, a FIFO memory may be provided in the digital back end. Values of sensor data may be stored in this FIFO.

Figure 2:
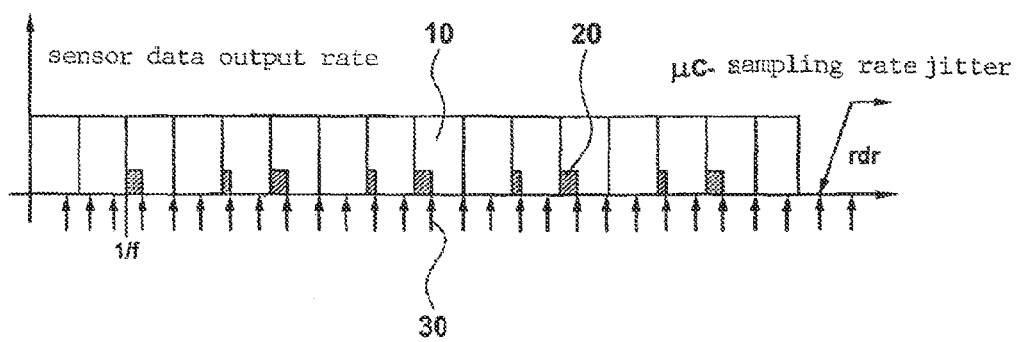
FIG. 2 shows a previously known sensor output data rate as a function of the read data rate of a control unit.
Figure 7:
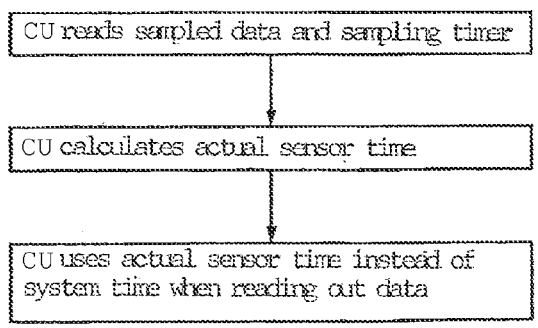
FIG. 7 shows a method for avoiding jitter during the data read-out of the sensor.

A further aspect of the present invention is a method for reducing jitter during the procurement of data from the sensor. FIG. 7 shows a method for avoiding jitter during the data read-out of the sensor. The control unit reads out the sensor data and the sensor time. The sampling timer portion of the sensor time content is directly the jitter shown in jitter boxes 20 of FIG. 2. The control unit calculates the data generation time, i.e., the actual sensor time, by subtracting the sampling timer*sampling period from its present system time. Control unit CU then uses the actual sensor time instead of the system time as a time stamp for the sampled data made available during data read-out.

Actual sensor data time=system time during data read-out−sampling timer*sampling period As an extension, an additional delay for sampling (for example, in the sensor front end), data processing (for example, in the sensor back end), and reading of the data may be subtracted.

Figure 8:
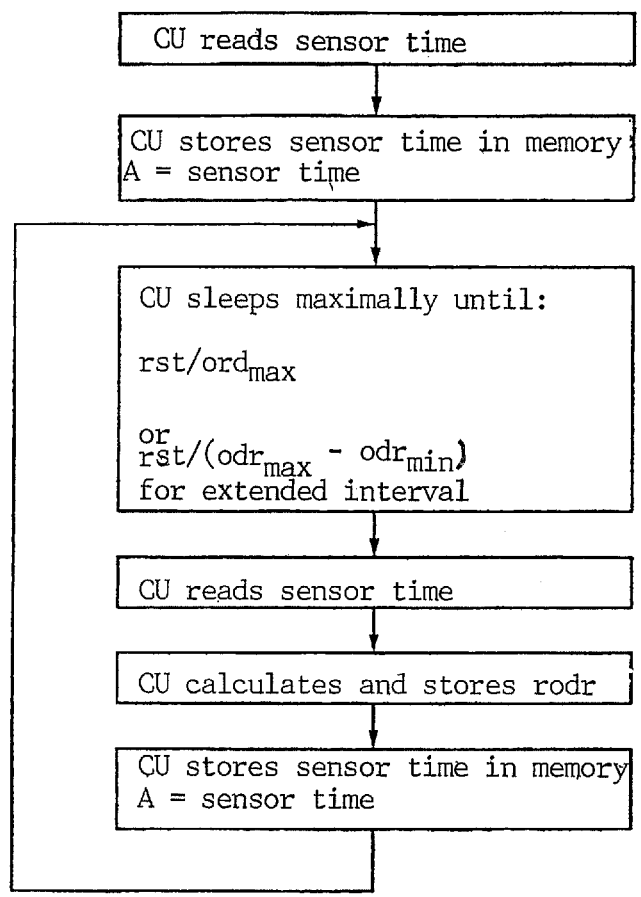
FIG. 8 shows a method for real output data rate estimation of the sensor.

A further aspect of the present invention is a method for estimating the real output data rate during the procurement of data from the sensor as shown in FIG. 8. It is assumed that the sensor time is read out atomically, i.e., in an operation on the digital interface, the sensor time must not change during the read operation, for example, the sampling counter must be compatible with the sampling timer.

Implementation Example:

The sensor time register has an area rst $$Rst <= 2^{bit\ of\ the\ sampling\ counter}$$

The maximum possible output data rate is $odr_{max}$.

A potential overflow may be corrected if the sensor time is read out at points in time t1 and t2 using $$t2 < t1 + rst/odr_{max}.$$

The real output data rate rodr (for example, in units of sample value(s)) may be estimated using $$rodr = \mathrm{mod}(\text{sensor time}(t2) - \text{sensor time}(t1), rst)/(t2 - t1)$$

the modulo operation of Knuth, Donald, E, The Art of Computer Programming, Addison-Wesley, 1972, being defined.

Applications of the rodr are a reduction of latency or reduction of jitter, for example, when FIFOs are used, before the control unit receives the data.

Figure 9:
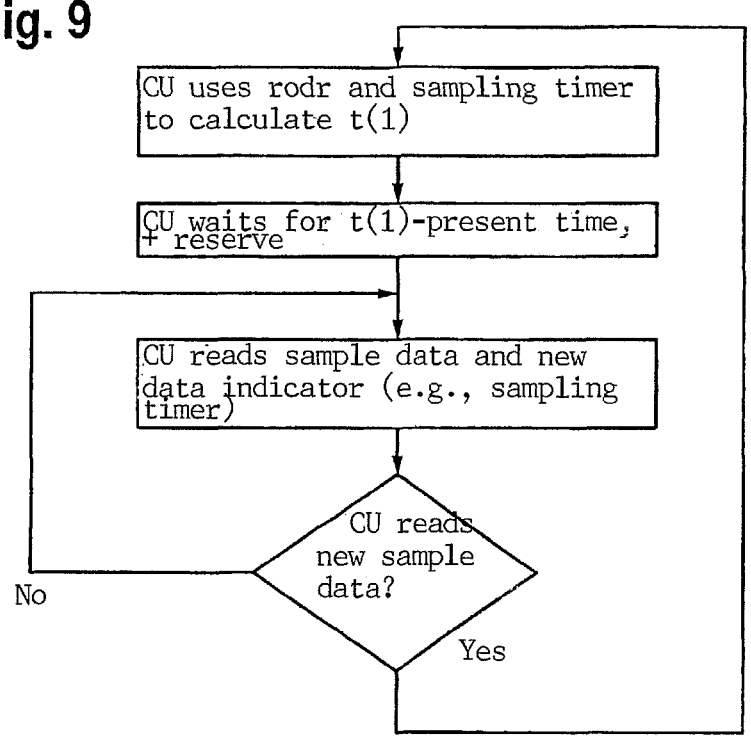
FIG. 9 shows a method for reducing latency when procuring data from the sensor.

A further aspect of the present invention is a method for reducing latency during the procurement of data from the sensor as shown in FIG. 9.

The rodr may then be used to calculate the future times t(n) at which the next n sample values are ready for the control unit to retrieve from the sensor, $$t(n)=t2+(n-\text{sampling timer}(t2))/rodr$$

$$n>=1 \ldots$$

The control unit may thus predict when the next data will be generated and is able to retrieve these with low latency, immediately after the data are available in the sensor.

Figure 10:
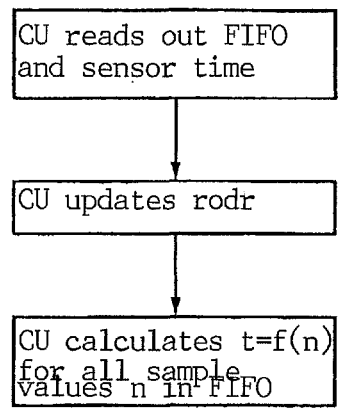
FIG. 10 shows a method for reducing jitter using a FIFO memory in the sensor.

A further aspect of the present invention is a method for reducing jitter using the FIFO memory in the sensor as shown in FIG. 10. The rodr may be used to calculate past times tf(n) at which the nte frame was generated in the FIFO.

$$tf(n)=t2-\text{sampling timer}(t2)+n-1)/rodr$$

If the odr is used instead of the rodr, an error of 5% results in the odr in a FIFO having 10 elements in 50% of a sampling period jitter. This problem is solved when using rodr instead.

A further aspect of the present invention is a method for extending the measuring interval of the sensor as shown in FIG. 8.

The limitation of the measuring interval to $$rst/odr_{max}$$

may be eased if the minimal possible output data rate $odr_{min}$ is known by the measuring interval $$rst/(odr_{max}-odr_{min})$$

whereby a clear correlation with the number of sensor time overflows sto with respect to sensor time (t1) is made possible, $$rodr=\text{mod}(\text{sensor time}(t2)-\text{sensor time}(t1),rst)+sto*rst/(t2-t1)$$

where $$sto = \begin{cases} sto_{min} & \text{for } realmod >= stomod_{min} \\ sto_{min}+1 & \text{for } realmod < stomod_{min} \end{cases}$$

with $$sto=(t2-t1)*odr_{min}/rst$$

$$sto\ \text{mod}_{min}=\text{mod}((t2-t1)*odr_{min},rst)$$

$$realmod=\text{mod}(\text{sensor time}(t2)-\text{sensor time}(t1),rst)$$

Here, $sto_{min}$ is the minimum number of sensor time overflows, which is based on the minimal odr. A sensor time overflow at point in time t exists when $$\text{sensor time}(t)=\text{sensor time}(t1).$$

The maximum number of overflows may only be greater by one than the minimum number; otherwise the clear correlation of sensor time overflows with the sensor time is no longer possible. If the modulo value from the measured sensor time data is below the modulo value of the minimum odr, there must be an additional sensor time overflow.

What is claimed is:

1. A sensor, comprising:
   a detection element;
   an analog front end;
   a digital back end, wherein the digital back end is configured to be connected to a control unit via a digital interface, and wherein the sensor provides sampled data in the digital back end; and
   a timer unit for providing pieces of time information regarding the sampled data in the digital back end which the control unit accesses via the digital interface,
   wherein the timer includes a sampling timer register and a sampling counter register.

2. The sensor as recited in claim 1, wherein the sampling timer register is read out in an atomic operation.

3. The sensor as recited in claim 2, wherein the digital back end includes a FIFO memory.

4. A method for assigning a piece of time information to sampled measuring data of a sensor, comprising:
   a) providing a sensor having:
      a detection element;
      an analog front end;
      a digital back end, wherein the digital back end is configured to be connected to a control unit via a digital interface, and wherein the sensor provides sampled data in the digital back end; and
      a timer unit for providing pieces of time information regarding the sampled data in the digital back end which the control unit accesses via the digital interface wherein the timer unit includes a sampling timer register and a sampling counter register;
   b) providing a control unit, which is connected to the sensor via a digital interface;
   c) accessing, by the control unit, the sampled data of the sensor;
   d) accessing, by the control unit, the piece of time information regarding the sampled data of the sensor;
   e) calculating, by the control unit, a time stamp; and
   f) assigning, by the control unit, the time stamp to the sampled data.

5. The method as recited in claim 4, wherein the control unit is configured to reduce data read-out latency by reading the sampled data when a predicted sampling time has been reached, and wherein the method is used to predict the time at which the next sampled data are made available in the digital back end.

6. The method as recited in claim 4, wherein the control unit is configured to reduce jitter of the time stamps, the control unit using the sampling timer register to calculate an actual sampling time using a sub-sampling resolution.

7. The method as recited in claim 6, wherein the digital back end of the sensor includes a FIFO memory, and the time stamps t are calculated using t=f(n) for the sample values 1 . . . n in the FIFO.

* * * * *